United States Patent [19]
Otsuki et al.

[11] Patent Number: 5,846,853
[45] Date of Patent: *Dec. 8, 1998

[54] PROCESS FOR BONDING CIRCUIT SUBSTRATES USING CONDUCTIVE PARTICLES AND BACK SIDE EXPOSURE

[75] Inventors: Hideaki Otsuki; Toshio Kato; Yoko Gofuku; Fumio Matsukawa, all of Hyogo-ken, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 636,915

[22] Filed: Apr. 24, 1996

Related U.S. Application Data

[63] Continuation of Ser. No. 322,031, Oct. 12, 1994, abandoned, which is a continuation of Ser. No. 983,809, Nov. 24, 1992, abandoned.

[30] Foreign Application Priority Data

Dec. 11, 1991 [JP] Japan ................................ 3-327368
Feb. 17, 1992 [JP] Japan ................................ 4-029581
May 13, 1992 [JP] Japan ................................ 4-120479

[51] Int. Cl.$^6$ ......................... H01L 21/288; H01L 21/58; H01L 21/60
[52] U.S. Cl. ............................................. 438/119; 438/613
[58] Field of Search .................................. 437/203, 213, 437/223, 229, 183; 257/737, 746; 228/180.22; 438/613, 119

[56] References Cited

U.S. PATENT DOCUMENTS

| | | | |
|---|---|---|---|
| 4,157,932 | 6/1979 | Hirata | 156/310 |
| 4,749,120 | 6/1988 | Hatada | 228/180.22 |
| 4,811,081 | 3/1989 | Lyden | 357/80 |
| 4,855,808 | 8/1989 | Tower et al. | 357/74 |
| 4,859,268 | 8/1989 | Joseph et al. | 156/275.5 |
| 4,918,504 | 4/1990 | Kato et al. | 357/23.7 |
| 4,922,321 | 5/1990 | Arai et al. | 357/68 |

(List continued on next page.)

FOREIGN PATENT DOCUMENTS 57-54888  10/1983  Japan .
62-43138   2/1987  Japan .

(List continued on next page.)

OTHER PUBLICATIONS

Microelectronics Packaging Handbook, New York, Van Nostrand Reinhold, 1989, pp. 379, 380, 898, 899. TK7874, T824 1988.

M. Masuda, et al, "Chip on Glass Technology for Large Capacity & High Resolution LCD" IEMT 1989 Proceedings pp. 57–60.

Hisashi Atarashi, et al "Chip on Glass Technology using Conductiv Particles & Lighsetting Adhesives" IMC 1990 Proceedings pp. 190–195.

*Primary Examiner*—David Graybill
*Attorney, Agent, or Firm*—Wolf, Greenfield & Sacks, P.C.

[57] ABSTRACT

A circuit substrate connection method for assuring to connect the semiconductor parts or sub-circuit substrate to a main circuit substrate such as liquid crystal display panel by avoiding a short between the electrodes on the same substrate. In the present invention, photosensitive resin including conductive particulates is painted on the transparent circuit substrate, and a light is radiated from the bottom of the main circuit substrate. As the electrode of the circuit substrate shields the light, the conductive particulates are removed together with the photosensitive resin other than on the electrode by developing the main circuit substrate. Further, in the present invention, the photosensitivity resin is painted on the transparent main circuit substrate, the photosensitivity resin on the electrode on the main circuit substrate are removed, the conductive particulates are filled in the removed portion, and thus only the conductive particulates are arranged only on the electrodes.

13 Claims, 7 Drawing Sheets

U.S. PATENT DOCUMENTS

| | | | |
|---|---|---|---|
| 4,963,002 | 10/1990 | Tagusa et al. | 350/336 |
| 5,117,300 | 5/1992 | Wiemer | 359/88 |
| 5,196,371 | 3/1993 | Kulesza et al. | 437/183 |
| 5,242,511 | 9/1993 | Yokoyama et al. | 148/430 |
| 5,264,467 | 11/1993 | Distefano | 523/218 |
| 5,445,308 | 8/1995 | Nelson et al. | 228/180.22 |

FOREIGN PATENT DOCUMENTS

| | | | |
|---|---|---|---|
| 63-9942 | 1/1988 | Japan | 437/183 |
| 63-81829 | 4/1988 | Japan | 437/183 |
| 64-2331 | 1/1989 | Japan | 437/183 |
| 1201932 | 8/1989 | Japan . | |
| 2-2185036 | 7/1990 | Japan | 437/183 |
| 2-284438 | 11/1990 | Japan | 228/180.22 |
| 2280334 | 11/1990 | Japan . | |
| 3-30350 | 2/1991 | Japan | 437/183 |
| 3-209831 | 9/1991 | Japan | 437/183 |
| 91-226038 | 10/1991 | Japan | 437/183 |
| 4-37044 | 2/1992 | Japan | 437/183 |
| 3-209840 | 9/1992 | Japan | 437/183 |
| 5-41404 | 2/1993 | Japan | 228/180.22 |
| 4-116944 | 4/1993 | Japan | 437/183 |
| 6-124952 | 5/1994 | Japan | 437/183 |

PRIOR ART

PROCESS FOR BONDING CIRCUIT SUBSTRATES USING CONDUCTIVE PARTICLES AND BACK SIDE EXPOSURE

This application is a continuation of application Ser. No. 08/322,031, filed Oct. 12, 1994, abandoned, which is a continuation of application Ser. No. 07/983,809, filed Nov. 24, 1992, abandoned.

BACKGROUND OF THE INVENTION

1. Field of the Invention

The invention relates to a circuit substrate connection method which connects the semiconductor parts or sub-circuit substrates to the electrodes formed on the main circuit substrate. For example, the method is used for connecting a liquid-crystal driving IC, a glass substrate or a film carrier substrate which mounts electric parts such as an IC chip thereon to the electrodes formed on the liquid crystal panel.

2. Description of the Prior Art

In recent years, a face-down soldering method is generally used for a circuit substrate connecting method such as a method for mounting a liquid crystal driving IC to a liquid display panel. It is necessary to heat the solder up to a temperature over the melting point according to this kind of soldering method. Therefore, there is a problem that the liquid crystal display panel is degraded by the heat. A new method has been proposed for mounting a liquid crystal driving IC to the liquid display panel without using soldering. One of such methods is described in the laid-open patent publication 63-55527.

Figure 9:
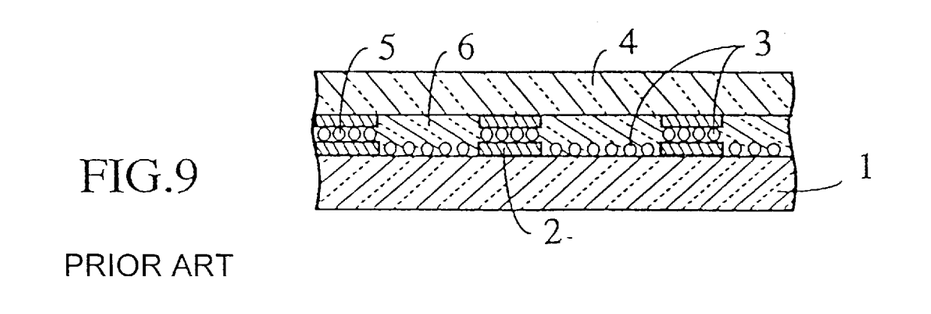
FIG. 9 is a sectional view explaining a conventional connection method of the circuit substrate.

FIG. 9 is sectional view showing a connection portion of the liquid crystal apparatus in which the semiconductor parts are connected by the conventional method. In the FIG. 1 is a liquid crystal display panel comprised of a transparent substrate such as glass. 2 is an electrode formed on the liquid crystal display panel 1. 3 is a conductive particulate plated by a metal such as nickel or gold on the surface of a resin sphere, e.g. "MICROPEARL" (trademark, made by Sekisui Fine Chemical Corp). 4 is a semiconductor part such as a liquid crystal driving IC mounted on the substrate 1, where an electrode 5 is electrically connected to the above electrode 2 through the conductive particulate 3. 6 is a glue layer, which fixes the liquid crystal driving IC 4 to the liquid crystal display panel 1, and which is comprised of ultraviolet curing resin.

The mounting method of the liquid crystal display panel 1 and the liquid crystal driving IC 4 of the above conventional liquid crystal display apparatus are explained here. At first, a desired amount of the conductive particulates 3 is sprayed by an air gun on the surface of the liquid crystal display panel 1 having the electrode 2 on it. The amount of the conductive particulates 3 is selected so that the electrode 2 is electrically conducted with the electrode 5 on the semiconductor parts 4, and the electrodes 2 on the liquid crystal display panel 1 are not electrically shorted between them. Then, ultraviolet curing resin is painted on the surface of the liquid crystal driving IC 4 having the electrode 5 on it. Then, the electrode 2 and the electrode 5 are faced each other and the liquid crystal display panel 1 and the liquid crystal driving IC 4 are pressed to be adhered. Then, ultraviolet light is radiated to the adhesive surface from the back of the liquid crystal display panel 1 so that the ultraviolet curing resin forming a glue layer is cured and the semiconductor parts 4 are adhered to the above liquid crystal display panel 1.

There is another method for connecting the liquid crystal display panel to a circuit substrate, comprised of glass, on which liquid crystal driving ICs are mounted. For example, the COG-Stick method is described in the technical journal of Micro Technical Laboratory. In this method, the connection was carried out by an anisotropic adhesive having dispersed conductive articulates on an insulated resin as well as the above method for connecting the liquid crystal driving IC. That is, in this method, the anisotropic adhesive is painted on the picture element terminal of the liquid crystal display panel using a printing technology, then the picture terminal of the liquid crystal terminal and the connection terminal of the circuit substrate are overlapped by aligning the terminals, then the anisotropic adhesive is cured by heating and pressing from the back of the circuit substrate.

In the above conventional circuit substrate connection method, the conductive particulates 3 sometimes happen to deviate to a particular part on the liquid crystal display panel 1. Therefore, there arises a problem that the electrodes 2 are shorted between them by the remaining conductive particulates 3 between the electrodes 2 on the liquid crystal display panel.

It is an object of the present invention to provide a circuit substrate connection method for connecting semiconductor parts or sub-circuit substrate to the liquid crystal display panel.

It is another object of the present invention to provide a circuit substrate connection method for avoiding a short which may otherwise occur between the electrodes on the substrate.

SUMMARY OF THE INVENTION

According to one aspect of the present invention, a circuit substrate connection method comprises steps for painting photosensitive resin including conductive particulates on the main circuit substrate having an electrode thereon, exposing said photosensitive resin selectively and removing photosensitive resin other than on said electrode, gluing said semiconductor part or sub-circuit substrate with said main circuit substrate by contacting said electrode on the semiconductor part or sub-circuit substrate to said electrode on the main circuit substrate through said conductive particulates.

According to another aspect of the present invention, a circuit substrate connection method comprises steps for painting photosensitive resin on the main circuit substrate having an electrode thereon, exposing said photosensitive resin selectively and removing photosensitive resin on said electrode, filling conductive particulates in the removed portion of said photosensitive resin, gluing said semiconductor part or sub-circuit substrate with said main circuit substrate by contacting said electrode on the semiconductor part or sub-circuit substrate to said electrode on the main circuit substrate through said conductive particulates.

DETAILED DESCRIPTION OF THE PREFERRED EMBODIMENTS

Embodiment 1

Figure 1:
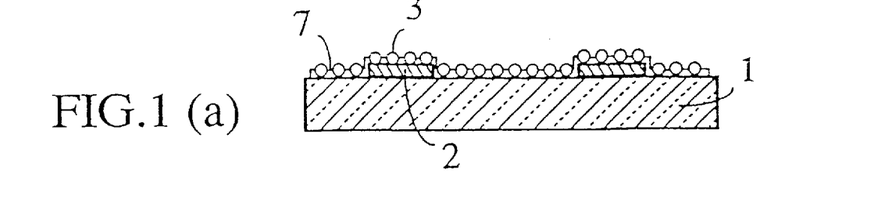
FIGS. 1(a)–1(e) are sectional views explaining a production process of a connection method of the circuit substrate of an embodiment of the present invention.

One of the embodiments of the present invention is described here using FIG. 1. FIG. 1 is a production process diagram showing a connection method of the circuit substrate of an embodiment of the present invention, wherein sectional views of the connection portion of the liquid crystal display apparatus are shown. In the FIG. 7 is a positive type photosensitive resin including many conductive particulates 3 in it. 8 is an exposing apparatus for exposing the photosensitive resin 7. 9 is a ultraviolet radiation apparatus for curing ultraviolet curing resin.

As shown in FIG. 1(a), the positive type photosensitive resin including conductive particulates 3 is painted on the surface of the mounting portion of the liquid crystal display panel 1 by a thickness of around several $\mu$m using a spin-coat method or a printing method. Then, the liquid crystal display panel 1 is heated to around 90° C. and the positive type photosensitive resin 7 is pre-baked.

In FIG. 1(b), the positive type photosensitive resin 7 of the mounting portion of the liquid crystal display panel 1 is exposed by the exposing apparatus 8 from the back surface of the liquid crystal display panel 1. Since a wiring pattern such as the electrode of the liquid crystal display panel 1 is formed by a material such as aluminum which shields the light, it functions as a mask.

FIG. 1(c) shows the conductive particulates 3 arranged selectively on the electrodes by developing the conductive particulates 3 after the above exposure process.

In FIG. 1(d), the ultraviolet curing resin 6 is painted on a portion of the liquid crystal display panel 1 and the liquid crystal driving IC 4 is aligned and pressed on the liquid crystal display panel 1. At this time, the positive type photosensitive resin 7 filled around the conductive particulates 3 is extruded from the electrode portions. As a result, the electrode 2 of the liquid crystal display panel 1 and the electrode of the liquid crystal driving IC 4 electrically contact through the conductive particulates 3.

In FIG. 1(e), the ultraviolet light is radiated to the adhesive surface from the back surface of the liquid crystal display panel 1 by the ultraviolet radiation apparatus 9 so that the ultraviolet curing resin 6 is cured and the liquid crystal driving IC 4 is fixed on the liquid crystal display panel 1.

As described above, since the conductive particulates 3 are removed from the portion between the electrodes 2 on the liquid crystal display panel 1, there is no occurrence of short between the electrodes 2. Further, since the positive type photosensitive resin 7 including the conductive particulates 3 is painted with uniform thickness by the spin-coat method or printing method, the conductive particulates 3 disperse uniformly on the entire surface of the liquid crystal display panel 1. Therefore, there occurs no place where there is insufficient conductivity because of a lack of the conductive particulates 3 on the electrode 2. Also, there occurs no portions where the electrode 2 on the liquid crystal display panel 1 and the electrode 5 on the semiconductor part 4 do not contact because of the different height of the conductive particulates 3 overlapping on each electrode 2. Further, since the conductive particulates 3 can be arranged selectively on the electrode of the liquid crystal display panel 1 at an accurate position using a photolithographic technology, the liquid crystal display panel 1 which has a tendency of fine pitch and multi-terminals is easily connected with the liquid crystal driving IC 4.

In the present embodiment, the number of the conductive particulates 3 on the electrode 2 can be easily controlled by the rotation number of the spin coat and the number of the conductive particulates 3 mixed in the photosensitive resin. Since the liquid crystal display panel 1 is constructed of the transparent substrate, wiring patterns of the electrode 2 at the mounting portion of the liquid crystal display panel 1 can be used for an exposure mask. Therefore, it is not neccessary to fabricate further mask for exposing the photosensitive resin. If the mask aligning process is omitted, the cost for removing the photosensitive resin 7 is not needed. Further, since the mask is not needed in the exposure process, the alignment between the mask and the liquid crystal display panel 1 is not needed. Therefore, the occurrence of no good portions by the deviation of the position is avoided, and thus yield is improved.

In the present embodiment, since the ultraviolet curing resin 6 is used for fixing the liquid crystal display panel 1 and the liquid crystal driving IC 4, the process for heating the liquid crystal display panel 1 up to a high temperature can be avoided. Therefore, the liquid crystal display panel 1 does not degrade and also the reliability of the liquid crystal display apparatus can be improved.

Further, since the electrode 2 of the liquid crystal display panel 1 and the electrode 5 of the liquid crystal driving IC 4 are connected through the conductive particulates 3, it is not neccessary to form an extruded electrode on the electrode 5 of the liquid crystal driving IC 4 by, for example, soldering. Therefore, the fabrication cost of the liquid crystal driving IC 4 can be decreased. Of course, the present invention can be applied to all liquid crystal driving ICs 4 regardless of the existence of the extruded electrode.

Also, in the present liquid crystal display panel described above, since the electrode 2 of the liquid crystal display panel 1 and the electrode 5 of the liquid crystal driving IC 4 are connected through the conductive particulates 3, the liquid crystal driving IC 4 can be slid toward the transverse direction if the thermal or mechanical stress functions to the liquid crystal display panel 1 or the liquid crystal driving IC 4. Therefore, a breakdown of the connection portion can be avoided.

Figure 2:
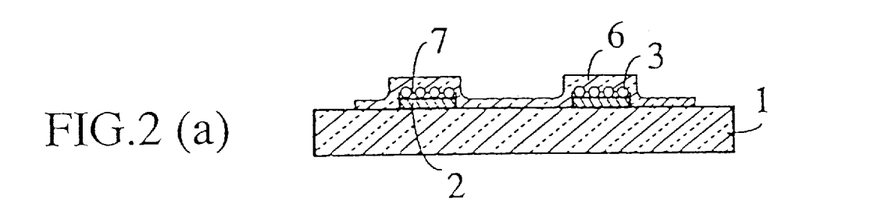
FIGS. 2(a) and 2(b) are sectional views explaining a production process of a connection method of the circuit substrate of another embodiment of the present invention.

As shown in FIG. 2(a), the ultraviolet curing resin 6 is painted on all mounting surfaces of the liquid crystal driving IC 4 and the liquid crystal display panel 1 so that it covers the electrode 2. As shown in FIG. 2(b), the ultraviolet curing resin 6 is filled thoroughly in the gap between the liquid crystal display panel 1 and the liquid crystal driving IC 4 and it functions as a protection mold for the liquid crystal driving IC 4. Therefore, the resin molding process for protecting the liquid crystal driving IC 4 can be eliminated. Accordingly, the productivity of the liquid crystal display panel can be improved and the high reliability of the resin mold can be obtained.

Embodiment 2

Figure 3:
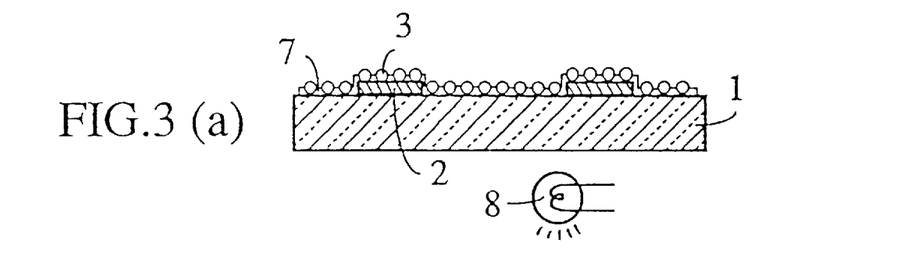
FIGS. 3(a)–3(e) are sectional views explaining a production process of a connection method of the circuit substrate of another embodiment of the present invention.

FIG. 3 is another embodiment of the present invention. In the FIG. 1 is a liquid crystal display panel comprised of a transparent substrate such as ceramic. 6 is a glue layer formed of a heat curing resin, for example, "XNR5152" (trademark, produced by Japanese Chiba Gaigi). 10 is a mask having the same light pattern 11 formed by the shielding material on it as the connection portion formed on the liquid crystal display panel.

The following description is for a mounting method for a semiconductor part on the liquid crystal display panel 1 comprised of the transparent substrate described above.

As shown in FIG. 3(a), the positive type photosensitive resin including conductive particulates 3 is painted on the surface of the liquid crystal display panel 1 by a thickness of around several $\mu$m using a spin-coat method and so on, as described in the embodiment 1. Then, the liquid crystal display panel 1 is heated to around 90° C. and the positive type photosensitive resin 7 is pre-baked.

In FIG. 3(b), the upper surface of the liquid crystal display panel 1 is aligned with the mask 10, then the positive type photosensitive resin 7 of the mounting portion of the liquid crystal display panel 1 is exposed by the exposing apparatus 8 from the top surface of the mask 10.

As shown in FIG. 3(c), the photosensitive resin is developed and the conductive particulates 3 selectively remain on the electrode 2 of the liquid crystal display panel 1.

In FIG. 3(d), the thermo-curing resin 6 is painted on a mounting portion of the liquid crystal driving IC 4 on the liquid crystal display panel 1 and the liquid crystal driving IC 4 is aligned and pressed on the liquid crystal display panel 1.

In FIG. 3(e), the thermo-curing resin 6 is cured by laying the panel in an atmosphere of 120° C. during about one hour, then the liquid crystal driving IC 4 is fixed on the liquid crystal display panel 1.

In the present embodiment 2, since the substrate forming a liquid crystal display panel 1 does not pass light through in contrast with the embodiment 1, the photosensitive resin between the electrodes 2 can be removed by the exposure through the mask 10 from the top surface thereof. Then, the conductive particulates 3 can be arranged selectively on the electrodes 2. Therefore, the present embodiment 2 can be applied to a liquid crystal display apparatus having fine pitch electrodes 2 as in embodiment 1.

In the embodiment 2, the positive type photosensitive resin 7 is used, but the negative type photosensitive resin can be used by using a reverse type mask instead of the above mask 10.

Embodiment 3

Figure 4:
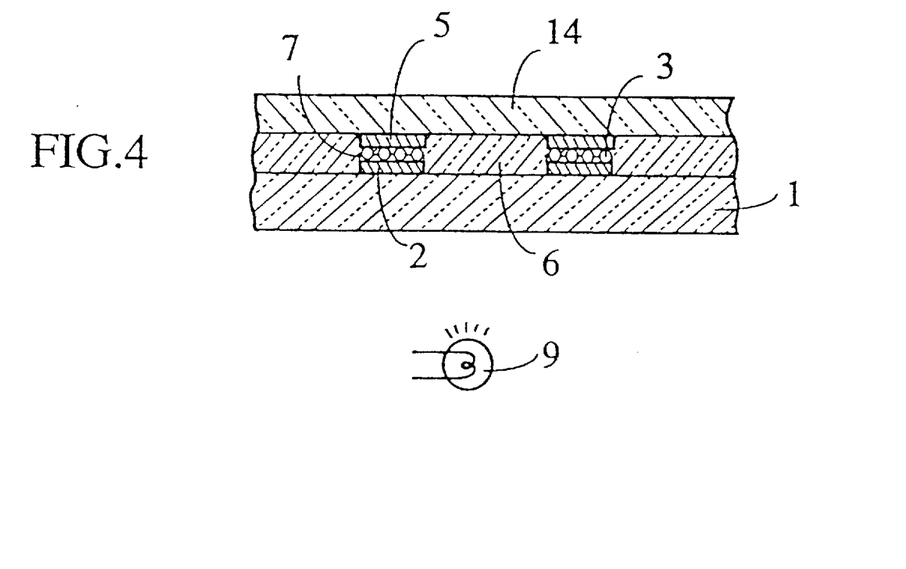
FIG. 4 is a sectional view explaining a production process of a connection method of the circuit substrate of another embodiment of the present invention.

In the above embodiments, a semiconductor part such as the liquid crystal driving IC 4 is described which is connected to a main circuit substrate such as the liquid crystal display panel 1. But this invention can be applied to a sub-circuit substrate such as a glass substrate or a film carrier substrate mounting electrical parts such as IC chip thereon which is connected to a main circuit substrate. And also, this invention can be applied to both the semiconductor part and the sub-circuit substrate connected to a main circuit substrate. FIG. 4 is a sectional view showing the case in which a sub-circuit substrate 14 is connected to the liquid crystal display panel 1. The connection method is the same as that in FIG. 2.

Embodiment 4

Figure 5:
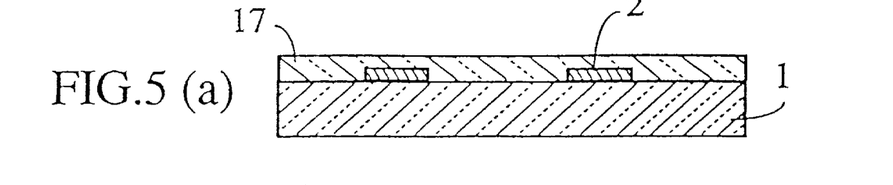
FIGS. 5(a)~5(f) are sectional views explaining a production process of a connection method of the circuit substrate of another embodiment of the present invention.

Another embodiment of the present invention is explained here using FIG. 5. FIG. 5 is a production process explaining a connection method of the circuit substrate of embodiment 4 of the present invention. In the FIG. 17 is a negative type photosensitive resin. 8 is an exposing apparatus for exposing the photosensitive resin. 9 is a ultraviolet radiation apparatus for curing ultraviolet curing resin.

In FIG. 5(a), the negative type photosensitive resin 17 is painted on the surface of the mounting portion of the liquid crystal display panel 1 using a spin-coat method or a printing method.

In FIG. 5(b), the negative type photosensitive resin 17 at the liquid crystal display panel 1 is exposed by the exposing apparatus 8 from the back surface of the liquid crystal display panel 1. Since a wiring pattern as on the electrode 2 on the liquid crystal display panel 1 is formed by a shielding material such as aluminum film, the wiring pattern functions as a mask.

Figure 5C:
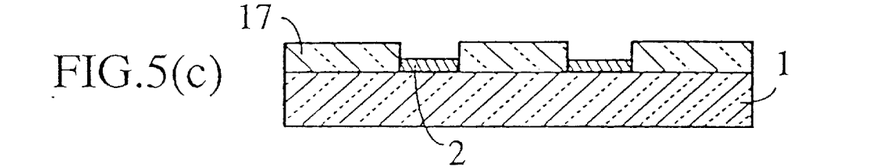

In FIG. 5(c), the negative type photosensitive resin 17 on the electrodes is removed by the development after the above exposure process.

In FIG. 5(d), the conductive particulates 3 are filled in the removed portion of the negative type photosensitive resin 17 for selectively arranging the conductive particulates 3 on the electrode 2.

In FIG. 5(e), ultraviolet-curing resin 6 is painted partially on a mounting portion of the liquid crystal driving IC 4 on the liquid crystal display panel 1 and the liquid crystal driving IC 4 is aligned and pressed on the liquid crystal display panel 1.

In FIG. 5(f), the ultraviolet light is radiated to the adhesive surface from the bottom surface of the liquid crystal display panel 1 so that the ultraviolet curing resin 6 is cured and then the liquid crystal driving IC 4 is fixed on the liquid crystal display panel 1.

In the embodiment 4, the conductive particulates do not exist between the electrode 2 on the liquid crystal display panel 1, and the photosensitive resin 17 having good insulation exists on the liquid crystal display panel 1. Therefore, a short does not occur between the electrodes 2. Further, since the photosensitive resin 17 on the electrode 2 on the liquid crystal display panel 1 is removed using a photolithographic technology, and the conductive particulates 3 are filled in the removed portion. Then, the conductive particulates 3 can be arranged selectively on the electrode of the liquid crystal display panel 1 at an accurate position. Accordingly, the present embodiment 4 can be easily applied to a connection between the liquid crystal display apparatus and the liquid crystal driving IC 4 having a tendency of fine pitch and multi-terminals.

In the present embodiment, since the liquid crystal display panel 1 is constructed of the transparent substrate, wiring patterns of the electrode 2 at the mounting portion of the liquid crystal display panel 1 can be used as an exposure mask. Therefore, it is not necessary to fabricate a particular mask for exposing the photosensitive resin, and thus the mask aligning process is omitted, and the cost for eliminating the photosensitive resin 17 is not needed. Further, since the mask is not needed in the exposure process, the alignment between the mask and the liquid crystal display panel 1 is not needed. Accordingly, the occurrence of no good portions by the deviation of the position are avoided, and thus yield is improved.

Further, in the present embodiment, since the ultraviolet curing resin 6 is used for fixing the liquid crystal display panel 1 and the liquid crystal driving IC 4, the process for heating the liquid crystal display panel 1 up to a high temperature can be avoided. Therefore, the liquid crystal display panel 1 does not degrade and also the reliability of the liquid crystal display apparatus can be improved.

Further, since the electrode 2 on the liquid crystal display panel 1 and the electrode 5 on the liquid crystal driving IC 4 is connected through the conductive particulates 3, it is not neccessary to form an extruded electrode on the electrode 5 on the liquid crystal driving IC 4 by, for example, soldering. Therefore, the fabrication cost of the liquid crystal driving IC 4 can be decreased. Of course, the present invention can be applied to all liquid crystal driving ICs 4 regardless of the existence of the extruded electrode.

Also, in the present liquid crystal display panel described above, since the electrode 2 on the liquid crystal display panel 1 and the electrode 5 on the liquid crystal driving IC 4 are connected through the conductive particulates 3, the liquid crystal driving IC 4 can be slid toward the transverse direction if the thermal or mechanical stress functions to the liquid crystal display panel 1 or the liquid crystal driving IC 4. Therefore, a breakdown, which usually occurs at a soldering portion, of the connection portion can be avoided.

Figure 6:
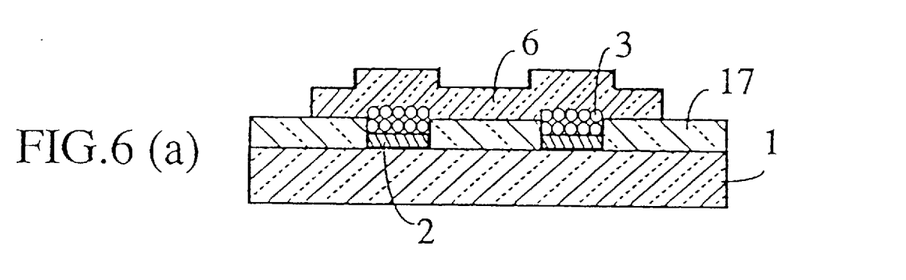
FIGS. 6(a) and 6(b) are sectional views explaining a production process of a connection method of the circuit substrate of another embodiment of the present invention.

In FIG. 6(*a*), the ultraviolet curing resin 6 is painted on all mounting surfaces so that it covers the conductive particulates 3 on the electrode 2 and the liquid crystal display panel 1. In FIG. 6(*b*), the ultraviolet curing resin 6 is filled thoroughly in the gap between the liquid crystal display panel 1 and the liquid crystal driving IC 4 as a protection mold of the liquid crystal driving IC 4. Therefore, the resin molding process for protecting the liquid crystal driving IC 4 can be eliminated. Accordingly, the productivity of the liquid crystal display panel can be improved and the high reliability of the resin mold can be obtained. The ultraviolet curing resin 6 on the conductive particulates 3 is extruded out of the conductive particulates 3 by the pressure which the liquid crystal driving IC 4 presses the liquid crystal display panel 1. As a result, the electrode 2 on the liquid crystal display panel 1 and the electrode 5 on the liquid crystal driving IC 4 are connected electrically through the conductive particulates 3.

Embodiment 5

Figure 7:
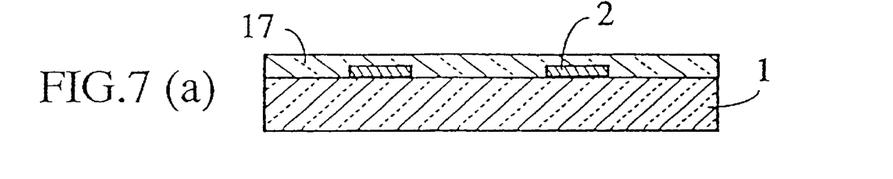
FIGS. 7(a)~7(f) are sectional views explaining a production process of a connection method of the circuit substrate of another embodiment of the present invention.

FIG. 7 is another embodiment of the present invention. In the FIG., 1 is a liquid crystal display panel comprised of a opaque substrate such as silicon or ceramic. 6 is a glue layer formed of a thermo-curing resin, for example, XNR5152 ( trademark, produced by Japanese Chiba Gaigi). 10 is a mask having the same light pattern 11 formed by the shielding material on it as the connection portion formed on the liquid crystal display panel.

The following description shows a method for mounting a semiconductor part on the liquid crystal display panel 1 comprised of the opaque substrate described above.

In FIG. 7(*a*), the photosensitive resin is painted on the surface of the liquid crystal display panel 1 as shown in the above embodiment.

In FIG. 7(*b*), the upper surface of the liquid crystal display panel 1 is aligned with the mask 10, then the positive type photosensitive resin is exposed from the top surface of the mask 10.

In FIG. 7(*c*), the photosensitive resin 17 is developed, and the photosensitive resin 17 on the electrode 2 is removed.

In FIG. 7(*d*), the conductive particulates 3 are filled in the removed portion.

In FIG. 7(*e*), thermo-curing resin 6 is painted on the photosensitive resin 17 on the liquid crystal display panel 1.

In FIG. 7(*f*), the liquid crystal driving IC 4 is aligned and pressed on the liquid crystal display panel 1. The thermo-curing resin 6 is cured by laying the panel in an atmosphere of 120° C. about one hour, then the liquid crystal driving IC 4 is fixed on the liquid crystal display panel 1.

In the present embodiment 5, since the substrate forming a liquid crystal display panel 1 does not pass through a light in contrast with the embodiment 4, the photosensitive resin on the electrodes 2 can be removed by the exposure through the mask 10 from the top surface thereof. Then, the conductive particulates 3 can be arranged selectively on the electrodes 2 by filling the conductive particulates 3 in the removed potion. Therefore, the present embodiment 5 can be applied to a liquid crystal display apparatus having fine pitch electrodes 2 as same as the embodiment 4.

In the embodiment 5, the negative type photosensitive resin 17 is used, but the positive type photosensitive resin can be used by using a reversed type mask instead of the above mask 10.

In the embodiment 5, the thermo-curing resin is used for a glue layer 6 for fixing the liquid crystal driving IC 4 on liquid crystal display panel 1. In generally, the curing temperature of the thermo-curing resin is about 100° C.~130° C., therefore, the reliability of the liquid crystal display panel 1 does not degrade.

Further, if an ordinary temperature curing resin, for example, "ARONALPHA" (trademark, produced by Toa Synthetic Chemical Corp) is used for the thermo-curing resin, a heating process at adhering the liquid crystal display panel 1 can be eliminated. Therefore, the reliability and the productivity are further improved.

Embodiment 6

Figure 8:
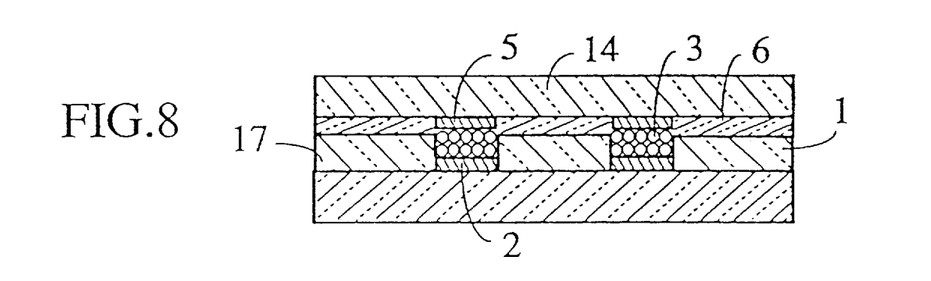
FIG. 8 is a sectional view explaining a production process of a connection method of the circuit substrate of another embodiment of the present invention.

In the above embodiments, a semiconductor part such as the liquid crystal driving IC 4 is described which is connected to a main circuit substrate such as the liquid crystal display panel 1. But this invention can be applied to a sub-circuit substrate such as a glass substrate or a film carrier substrate mounting electrical parts such as an IC chip thereon which is connected to a main circuit substrate. And also, this invention can be applied to both a semiconductor part and sub-circuit substrate connected to a main circuit substrate. FIG. 8 is a sectional view of a sub-circuit substrate 14 connected to the liquid crystal display panel 1. The connection method is the same as that in FIG. 6.

In the above embodiments, only the liquid crystal display panel is described, but this invention can be applied to a semiconductor part or sub-circuit substrate connected to a contact image sensor or thermal head.

Those skilled in the art will recognize that many modifications to the foregoing description can be made without departing from the spirit of the invention. The foregoing description is intended to be exemplary and in no way limiting. The scope of the invention is defined in the appended claims and equivalents thereto.

What is claimed is:

1. A circuit connecting method for connecting a first substrate having first electrodes to a second substrate of a transparent material having second electrodes on a major surface thereof, the method comprising steps of:

(a) providing a positive photosensitive resin layer including a plurality of conductive particulates on the major surface of the second substrate, each of the conductive particulates being a metal-plated resin particle;

(b) exposing the photosensitive resin layer with light through the second substrate using the second electrodes as a mask;

(c) developing the photosensitive resin layer including the conductive particulates to arrange the conductive particulates selectively on the second electrodes and removing the photosensitive resin layer from the major surface other than from the second electrodes;

(e) providing glue on the major surface of the second substrate; and (f) contacting the first electrodes on the first substrate to the second electrodes on the second substrate through the conductive particulates and bonding the first substrate and the second substrate with the glue.

2. The method of claim 1, wherein the first substrate includes a sub-circuit substrate formed of a glass substrate for mounting electrical parts thereon.

3. The method of claim 1, wherein the first substrate includes a sub-circuit substrate of a film carrier substrate for mounting electrical parts thereon.

4. The method of claim 1, wherein the first substrate includes a sub-circuit substrate.

5. The method of claim 1, wherein the glue includes an ultraviolet-curing resin.

6. The method of claim 1, wherein the glue includes a thermo-curing resin.

7. The method of claim 1, wherein step (a) comprises providing a layer several microns thick.

8. The of claim 1, wherein step (d) includes applying a layer of glue material on the second electrodes, and step (e) includes pressing the first substrate against the second substrate to extrude the glue from between the first and second electrodes so that the first electrodes contact the conductive particles and electrically interconnects the first and second electrodes.

9. The method of claim 1, wherein step (e) includes extruding photosensitive resin from between the first and second electrodes so that the conductive particulates electrically interconnect the electrodes.

10. The method of claim 1, wherein step (e) includes extruding the glue from between the first and second electrodes to fill a gap between the first substrate and the second substrate.

11. The method of claim 1, wherein step (e) includes extruding the glue from between the first and second electrodes so that the extruded glue forms a portion of the mechanical connection.

12. The method of claim 1, wherein step (d) includes providing the glue on the second substrate and the second electrodes.

13. The method of claim 1, wherein step (d) includes providing the glue between the second electrodes.

* * * * *